United States Patent [19]
Daalmans

[11] Patent Number: 4,801,882
[45] Date of Patent: Jan. 31, 1989

[54] THIN FILM SQUID MAGNETOMETER FOR A DEVICE FOR MEASURING WEAK MAGNETIC FIELDS

[75] Inventor: Gabriel M. Daalmans, Erlangen, Fed. Rep. of Germany

[73] Assignee: Siemens Aktiengesellschaft, Berlin and Munich, Fed. Rep. of Germany

[21] Appl. No.: 32,764

[22] Filed: Mar. 31, 1987

[30] Foreign Application Priority Data

May 21, 1986 [DE] Fed. Rep. of Germany ....... 3617045

[51] Int. Cl.[4] ................ G01R 33/035; G01R 33/022; H01L 39/22
[52] U.S. Cl. .................................. 324/248; 128/653; 357/5
[58] Field of Search ........................... 324/248; 357/5; 128/653; 29/599

[56] References Cited

U.S. PATENT DOCUMENTS

3,244,974  4/1986  Dumin ................................. 324/248
4,588,947  5/1986  Ketchen ......................... 324/248 X

FOREIGN PATENT DOCUMENTS

3247543  6/1984  Fed. Rep. of Germany .
3529815  2/1987  Fed. Rep. of Germany ...... 324/248

OTHER PUBLICATIONS

Muhlfelder et al., Double Transformer Coupling to a Very Low Noise Squid; IEEE Transactions on Magnetics, vol. Mag.-19, No. 3, May 1983, pp. 303-307.
Radio Engineering & Electronic Physics, vol. 29, No. 2, (1984) Feb. pp. 109-115, Silver Spring, MD, US; S. I. Bondarenko et al.: "Thin-Film Squids for Superconducting Magnetic Flux Measuring Devices".
Journal of Applied Physics, vol. 53, No. 11, Nov. 1982, pp. 7592-7598, New York US; P. Carelli et al., "Behaviour of a Multiloop DC Superconducting Quantum Interference Devices".
Planar Coupling Scheme For Ultra Low Noise DC Squids, Jaycox et al., IEEE Transaction on Magnetics, vol. Mag.-17, No. 1, Jan. 1981, pp. 400-403.
Squids and Their Applications in the Measurement of Weak Magnetic Fields by S. J. Swithenby; J. Phys. E: Sci. Instrum., vol. 13, 1980, pp. 801-813. Pinted in GT. Britain.
Advances in Squid Magnetometers by J. Clarke; IEEE Transactions on Electron Devices, vol. Ed-27, No. 10, Oct. 1980; pp. 1896-1908.
Instrumentation For Biomedical Applications by T. Katila; "Biomagnetism-Proceedings of the Third International Workshop on Biomagnetism, Berlin 1980" Walter de Gruyter & Co., Berlin/New York 1981, pp. 5-31.

Primary Examiner—Gerard R. Strecker
Attorney, Agent, or Firm—Kenyon & Kenyon

[57] ABSTRACT

A SQUID magnetometer is disclosed which can be fabricated by thin-film technology and used for apparatus for measuring weak magnetic fields. It contains a d-c SQUID with a SQUID loop surrounding the effective area of a coupling hole as well as a superconducting flux transformer with a gradiometer coil and a coupling coil surrounding the coupling hole thereby to achieve an effective inductive coupling of a measuring signal into the SQUID. To this end, the invention provides a separate superconducting surface (3a) with the coupling hole (4), to which the coupling coil (8) and or the SQUID loop (12) is/are assigned. The coupling coil (8) surrounds the SQUID loop (12) while maintaining a sufficient distance (e) for d-c decoupling.

7 Claims, 1 Drawing Sheet

U.S. Patent   Jan. 31, 1989   4,801,882
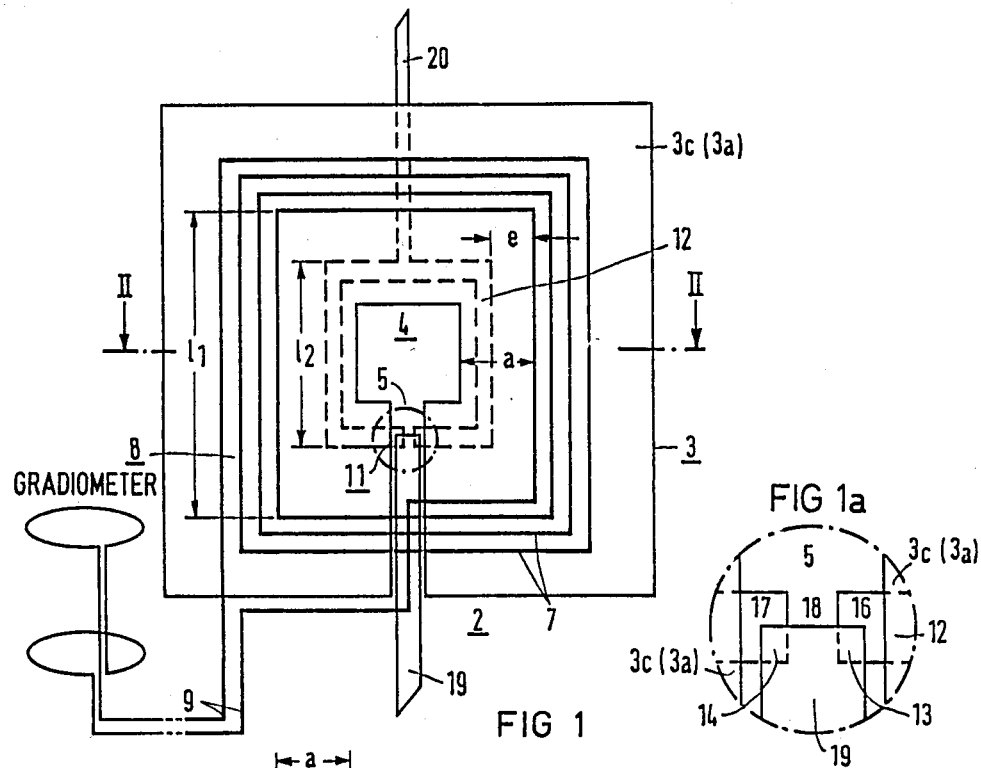
FIG 1
FIG 1a
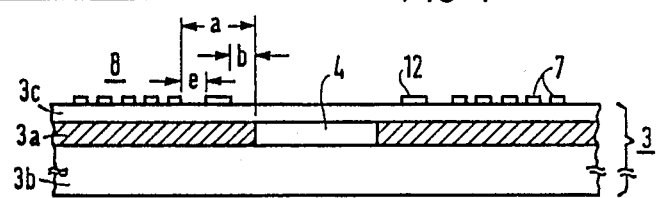
FIG 2
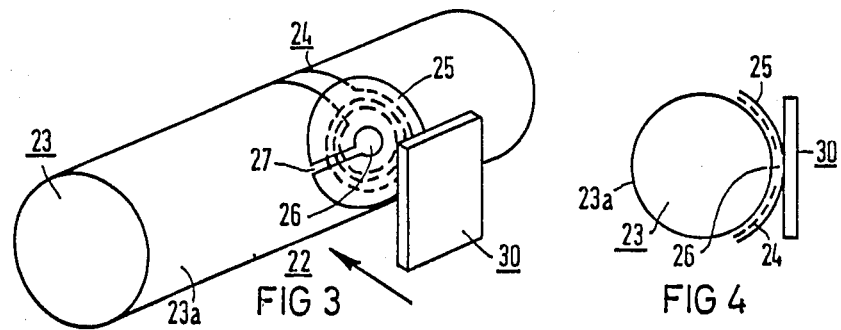
FIG 3
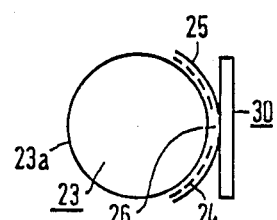
FIG 4

THIN FILM SQUID MAGNETOMETER FOR A DEVICE FOR MEASURING WEAK MAGNETIC FIELDS

BACKGROUND OF THE INVENTION a. Field of the Invention

The invention relates to a SQUID magnetometer made by using a thin-film technology and particularly useful for a device for measuring weak magnetic fields, wherein the magnetometer is of the kind having a d-c SQUID with a SQUID loop and a super conducting flux transformer for the inductive coupling of a measuring signal into the SQUID.

b. Description of the Prior Art

A measuring device with a SQUID can be found in the publication "IEEE Transactions on Magnetics," Vol., MAG-17, No. 1, January 1981, pages 400 to 403.

Superconducting quantum interferometers which are generally known in the art as SQUID's (Superconducting QUantum Interference Devices), are used for the measurement of very weak magnetic fields as described in "J. Phys. E.: Sci. Instrum.," Vol. 13, 1980, pages 801 to 813; and "IEEE Transactions on Electron Devices," Vol. ED-27, No. 10, October 1980, pages 1896 to 1908. These interferometers are particularly preferred in the field of medical technology, and in particular, magnetocardiology and magnetoencephalography, since the field intensities produced by magnetic heart and brain waves are in the order of about 50 pT and 0.1 pT, respectively. (See e.g. "Biomagnetism - Proceedings of the Third International Workshop on Biomagnetism, Berlin 1980," Berlin/New York 1981, pages 3 to 31).

For measuring such biomagnetic fields, measuring devices are known which can be designed with one or more channels (see, for instance, DE-OS No. 32 47 543). Depending on the number of channels, these devices contain at least one SQUID magnetometer.

Such a magnetometer can be made with thin-film technology, as described in the "IEEE Trans. Magn." reference mentioned above. It has a relatively wide ring-shaped SQUID loop of superconducting material which forms a quasi-square or rectangular frame about a corresponding shaped central coupling hole. On one side, this loop is interrupted by a narrow transversal slot which leads to the outside and is almost completely overlapped by a strip-shaped conductor run. In the free region of the slot (i.e., the region not covered by the conductor), the SQUID loop is closed with two Josephson tunnel elements characteristic for a d-c SQUID. The magnetometer also includes a frame-shaped coupling coil formed of superconductive turns surrounding the coupling hole. In this-known embodiment, the SQUID loop also serves as the supporting base plane for the coupling coil. This coupling coil, together with at least one superconducting gradiometer coil connected thereto forms a flux transformer, by which a measuring signal to be detected can be coupled into the SQUID via the SQUID loop. The coupling losses are here proportional to the self-inductance of the strip line which is formed by the coupling coil and the SQUID loop. The self-inductance is given by the following relationship:

$$L = u_0 \cdot 1 \cdot d_{iso}/WK$$

where 1 is the length of the coupling coil, $d_{iso}$ the distance between the SQUID loop and the coupling coil, W the track width of the coupling coil and K the so-called fringe factor which depends on $d_{iso}/W$. The self-inductance L is therefore a function of 1 and $d_{iso}/W$. More particularly, L is proportional to $d_{iso}/W$.

It has now been found that such magnetometers, especially for multichannel measuring devices, can be realized with satisfactory properties only with great difficulty. For example, the dimensions of the SQUID loop, for one, must be chosen at least large enough so that the turns of the relatively extensive coupling coil can be put on this loop. However, wide loop strips effect the properties of the SQUID adversely. Thus, undesirable resonances are observed between the straight conductor sections of the turns of the coupling coil and the SQUIDS located below. In addition, the parasitic inductance at the slot of the SQUID loop is relatively large. Because of this parasitic inductance, the coupling of the magnetic flux from the coupling coil into the SQUID is impeded correspondingly.

SUMMARY OF THE INVENTION

It is therefore an object of the present invention to improve the SQUID magnetometer of the type mentioned at the outset in such a manner that the mentioned unfavorable effects are substantially eliminated and in a simple manner.

According to the invention, this problem is solved by providing a special superconducting surface with the coupling hole with which the coupling coil and/or the SQUID loop are associated, and by disposing the coupling coil surrounding the SQUID loop at a preselected distance.

Overlap regions between the coupling coil and the SQUID loop are therefore substantially avoided. In addition, the undesirable determination of the minimum extent of the SQUID loop as a function of the coupling coil is advantageously eliminated. Also relatively small SQUID loops can now be made with the fine lithography required for making SQUIDS, independently of the relatively coarse lithography for forming the coupling coils. The inductance of the SQUID is determined mainly by the inductance of the coupling hole in the special superconducting surface and not by the dimensions of the coupling coil. An exact positioning of the SQUID loop around this coupling hole is consequently no longer necessary. This leads to a substantial facilitation in the design of the magnetometer.

The SQUID loop can surround the coupling hole while maintaining a certain spacing. The effective area of the coupling hole is then equal to the actual coupling hole area. However, it is also possible that a SQUID loop arranged in the edge zone of the coupling hole protrudes in its inner rim zone a distance into the coupling hole, i.e., it covers up an edge of the coupling hole. In this case, the effective area of the coupling hole is smaller that its actual area, and the inductance is determined not by the coupling hole but by the inside dimensions of the SQUID loop.

BRIEF DESCRIPTION OF THE DRAWINGS

For the further explanation of the invention, reference is made to the following in the drawings, wherein:

FIG. 1 shows a plan view of a preferred embodiment of magnetometer constructed in accordance with the invention;

FIG. 1a shows an enlarged view of a portion of FIG. 1;

FIG. 2 shows a side sectional view of FIG. 1 taken along axis II—II;

FIG. 3 shows an orthogonal view of another embodiment of the invention; and

FIG. 4 shows a side view of the embodiment of FIG. 3.

DETAILED DESCRIPTION OF THE INVENTION

FIGS. 1, 1a and 2 show a magnetometer generally designated with 2, made by using thin-film technology as described for instance, in the "IEE Trans. Magn." reference mentioned above. The magnetometer serves particularly for the construction of single- or multiple-channel measuring devices, preferably in the area of medical technology. However, as opposed to earlier devices, the magnetometer 2 contains a separate area 3a of a base element 3. This area 3a, which in the present case is to be considered as the base area, is applied to a substrate 3b which consists, for instance, of silicon. It is formed by a ring-shaped loop of superconductive material such as niobium and has an approximately square circumference so that the shape of an approximately squareshaped frame results. The loop surrounds a central, likewise approximately square coupling hole 4. Area 3a is interrupted completely on one side by a narrow transversal gap or slot 5 which leads from the coupling hole to the outside. The base area 3a is coated in a manner known per se by a galvanically (electrically) separating layer 3c. On this layer 3c, which consists, for instance, of SiO or SiO$_2$, the turns 7 which enclose the coupling hole 4 at a relatively large distance a are arranged, of a coupling coil 8 known per se. The number of turns forming, for instance, rectangular and in particular, approximately square loops is generally substantially larger than is detailed in FIG. 1. The coupling coil 8 is terminated in ends 9 which are brought out of the vicinity of the base area 3a. At least one loop of a known gradiometer, the coupling coil 8 forms a so-called superconducting flux transformer. Through this flux transformer and the special superconducting area 3a, a magnetic signal which can be detected by the gradiometer loop, can be coupled inductively into a d-c SQUID 11. The superconducting area 3a can therefore also be called a coupling plane. The SQUID 11 can advantageously be designed so that its selfinductance is small. To this end, it is composed substantially of an approximately square-shaped SQUID loop 12 which surrounds the coupling hole 4 at a relatively small distance d, and of two Josephson contacts or elements 13 and 14. SQUID loop 12 is likewise slotted in the area of the slot 5 of the base area 3a. The corresponding separating zone between the spaced opposite loop ends 16 and 17 of the SQUID loop 12 is designated with 18 as shown in FIG. 1a. Through the area of the slot 5 of the base area 3a further extends a SQUID connecting lead 19 which is wide enough so that it partially overlaps the two opposite ends 16 and 17 of the SQUID loop 12. The two Josephson contacts 13 and 14 are formed in the corresponding overlap areas. On the side of the SQUID loop 12 opposite the connecting lead 19 or the slot area 5, a second connecting lead 20 is provided which leads from the region of the base area 3a to the outside. Connecting leads 19 and 20 can be disposed either over or under the turns 7 of the coupling coil 8. A graphic presentation of further layers covering the SQUID 11 and the coupling coil 8 has been omitted in FIG. 2 for reasons of clarity.

Advantageously, the positioning of the SQUID loop 12 with respect to the coupling hole 4 is not particularly critical since the coupling of the coupling coil 8 to the SQUID 11 is accomplished via the base or coupling plane 3a galvanically (electrically) insulated therefrom. While the coupling coil 8 is magnetically strongly coupled to the SQUID 11 in this manner, direct coupling of the coil 8 and SQUID loop 12 can advantageously be avoided substantially, by the provision that these parts do not overlap as in the device described in reference "IEE Trans. Magn."

Instead, in the present invention loops 8 and 12 are spatially sufficiently separated from each other to eliminate direct coupling. The inside dimensions $1_1$ of the coupling coil 8 are therefore larger than the outside dimensions $1_2$ of the SQUID loop 12, a sufficient distance e being maintained between the turns 7 of the coupling coil and the SQUID loop.

According to the embodiment example shown in FIGS. 1 and 2, a rectangular and in particular, an approximately square-shaped coupling hole 4 was assumed, the shape of which results in a corresponding shape of the superconducting base area 3a, the SQUID loop 12 and the coupling coil 8. Parts 3a, 4, 12 and 8, can have other shapes and their shape need not correspond. Thus, for instance, an approximately circular coupling hole in an approximately annular base area can be enclosed by an approximately square-shaped SQUID loop and/or an approximately square-shaped coupling coil.

In addition, the SQUID loop 12 need not be made so large that between its inside edge facing the coupling hole 4 and the respective coupling hole edge, the small distance b exists. Also smaller inside dimensions of the SQUID loop are also possible. Thus, SQUID loops can also be provided, the inside dimensions of which are so small that they cover an edge region of the coupling hole 4.

As can clearly be seen from FIG. 2., the d-c SQUID 11 as well the turns of the coupling coil 8 are arranged directly on the separating layer 3c covering up the base area 3a.

However, it is also possible to place on layer 3c only the coupling coil or only the SQUID loop, while another support element is provided for the remaining coil or loop. Since these parts (i.e. coupling coil 8 and loop 12) must first be prefabricated separately they must be joined mechanically, for instance, by cementing or clamping in such a manner that an arrangement is obtained which approximately corresponds to the arrangement of the coupling coil and the SQUID loop shown in FIG. 1.

An alternative embodiment therefor is indicated in FIGS. 3 and 4. FIG. 3 represents here a partial orthogonal view of a magnetometer generally designated by 22. A cross section through this device can be seen from FIG. 4. According to this embodiment, there are located on the outer cylinder surface 23a of a cylindrical base element 23, a correspondingly curved approximately circular coupling coil 24 with several turns. This coupling coil is covered-up by a particular superconducting area 25 with a central circular coupling hole 26 and a radial slot 27, a galvanic (electric) separation between the coupling coil 24 and the cover or coupling surface 25 being assured. Optionally, the coupling area 25 and the coupling coil 24 can be applied to the cylinder surface 23a. A d-c SQUID not visible in the figures with a SQUID loop, the dimensions of which are matched to the size of the coupling hole 26 is located on a plane support element of its own, for instance, a silicon substrate. The corresponding SQUID chip is generally designated with 30 in the figures. According to the invention, it is therefore advantageously possible to couple a planar SQUID directly to a coupling coil which is located on a curved surface and thereby, a coupling coil with intrinsic curvature.

In the embodiment of FIGS. 3 and 4, it was assumed that the superconducting coupling surface 25 is assigned to the coupling coil 24. This is particularly advantageous in case of a curved coupling coil. If non-curved substrate supports are used, it is also possible to associate the superconducting coupling surface with the SQUID loop.

Obviously numerous modifications may be made to the invention without departing from its scope as defined in the appended claims.

What is claimed is:

1. A thin film SQUID magnetometer for measuring weak magnetic field comprising:
   a planar d-c SQUID containing a SQUID loop, two Josephson junctions and connecting leads lying on a first plane surface;
   a planar coupling coil lying on a second surface parallel to said first surface and surrounding said SQUID loop at a preselected distance to limit coupling between said SQUID loop and said coupling coil,
   a separate planar coupling element lying on a third surface parallel to said first plane and spaced from said d-c SQUID and said coupling coil for coupling energy between said d-c SQUID and said coupling coil, said coupling element including a superconducting area with a coupling hole, said SQUID loop surrounding said coupling hole, and
   a gradiometer coil cooperating with said coupling coil to form a superconducting flux transformer for inductively coupling a signal indicative of a magnetic field into said SQUID loop.

2. The SQUID magnetometer according to claim 1, wherein said SQUID loop surrounds said coupling hole while maintaining a distance (b).

3. The SQUID magnetometer according to claim 1, wherein the inside dimensions of the SQUID loop are at least partially smaller than the corresponding dimensions of the coupling hole, so that the SQUID loop covers the coupling hole accordingly.

4. The SQUID magnetometer according to claim 1 wherein the SQUID and the coupling coil are disposed on and electrically separated from said superconducting area.

5. The SQUID magnetometer according to claim 1 wherein only one of the coupling coil and the SQUID loop is associated with said superconducting area while the other of said coupling coil and SQUID coil is disposed on a further support element, said coupling coil and SQUID loop being at least largely concentric relative to the coupling hole.

6. The SQUID magnetometer according to claim 5, wherein the coupling coil is disposed on a curved surface and is covered up by the superconducting area.

7. A thin film SQUID magnetometer for measuring weak magnetic fields comprising:
   a planar d-c SQUID containing a SQUID loop, two Josephson junctions and connecting leads lying on a first plane surface,
   a curved coupling coil lying on a second surface curved with respect to said first surface and surrounding said SQUID loop at a preselected distance to limit coupling between said SQUID loop and said coupling coil,
   a separate curved coupling element lying on a third surface curved with respect to said first surface and spaced from said d-c SQUID and said coupling coil for coupling energy between said d-c SQUID and said coupling coil, said coupling element including a superconducting area with a coupling hole, said SQUID loop surrounding said coupling hole, and
   a gradiometer coil cooperating with said coupling coil to form a superconducting flux transformer for inductively coupling a signal indicative of a magnetic field into said SQUID loop.

* * * * *